United States Patent [19]
Hasegawa et al.

[11] Patent Number: 5,881,649
[45] Date of Patent: Mar. 16, 1999

[54] MAGNETIC TRANSFER SYSTEM, POWER TRANSMISSION MECHANISM OF THE MAGNETIC TRANSFER SYSTEM, AND ROTATIONAL DRIVING MEMBER USED FOR THE SYSTEM

[75] Inventors: Yoshiro Hasegawa, Tama; Naoyuki Suzuki, Fussa; Tomoaki Abe, Fuchu, all of Japan

[73] Assignee: Anelva Corporation, Tokyo, Japan

[21] Appl. No.: 905,765

[22] Filed: Aug. 4, 1997

[30] Foreign Application Priority Data

Aug. 13, 1996 [JP] Japan ................................. 8-231344

[51] Int. Cl.[6] .................................................. B61B 13/00
[52] U.S. Cl. ...................... 104/167; 104/166; 104/290; 414/218; 198/619; 198/657; 198/676
[58] Field of Search ..................................... 104/283, 290, 104/165, 166, 167; 310/12, 14; 318/687, 38, 135; 414/217, 218; 198/676, 657, 619

[56] References Cited

U.S. PATENT DOCUMENTS

| | | | |
|---|---|---|---|
| 2,837,223 | 6/1958 | Wolff | 104/167 |
| 3,898,487 | 8/1975 | Sobiepanek et al. | 104/167 |
| 4,615,274 | 10/1986 | Hoehn | 104/167 |
| 4,676,362 | 6/1987 | Malzkorn | 104/167 |
| 5,284,411 | 2/1994 | Enomoto et al. | 414/217 |
| 5,377,816 | 1/1995 | Deligi et al. | |

FOREIGN PATENT DOCUMENTS

A 7-280060 10/1995 Japan.

*Primary Examiner*—Mark T. Le
*Attorney, Agent, or Firm*—Oliff & Berridge, PLC

[57] ABSTRACT

To provide a magnetic transfer system capable of smoothly delivering a carrier between chambers by providing a independently-rotating carrier-feed driving shaft for each chamber without using a synchronous control mechanism and used for a semiconductor fabrication equipment or the like provided with a plurality of chambers. The magnetic transfer system is provided with a rotational driving member which is divided into two portions serving as a fixed driving shaft and a movable driving shaft in the axial direction and in which the fixed driving shaft is secured to a shaft core member and the movable driving shaft is set to the shaft core member so as to be limited in the rotational direction but so as to be freely movable in the axial direction at a certain width, and spiral magnetic coupling sections are formed on the surface of each driving shaft at the same pitch. The carrier can be freely moved against the surface of the rotational driving member in its axial direction, and is provided with magnetic coupling sections at an interval equal to a pitch in the spiral magnetic coupling sections. By rotating the rotational driving member, the carrier linearly moves.

34 Claims, 14 Drawing Sheets

MAGNETIC TRANSFER SYSTEM, POWER TRANSMISSION MECHANISM OF THE MAGNETIC TRANSFER SYSTEM, AND ROTATIONAL DRIVING MEMBER USED FOR THE SYSTEM

BACKGROUND OF THE INVENTION

1. Field of the Invention

The present invention relates to a magnetic transfer system for transmitting a driving force to a movable body by a non-contact system, suitable for a driving mechanism for transferring an object in a vacuum environment isolated from the atmosphere, and capable of performing smooth transfer generating less dust, a power transmission mechanism of the magnetic transfer system, and a rotational driving member preferably used for the magnetic transfer system.

2. Description of the Related Art

To transfer an object in a vacuum environment, a rack and pinion mechanism, roller-type driving mechanism, and chain driving mechanism have been frequently used. These driving mechanisms comprise a system for directly transmitting a driving force by a contact action and are referred to as a contact transmission system. This type of driving mechanism has the poor characteristics that friction coefficient increases and lubricating oil cannot be used in the vacuum environment. Therefore, there are problems that abrasion loss extremely increases and much dust is generated (this state is referred to as "dust generation"). Moreover, because the friction coefficient increases, the clearance of a contact portion must be increased and thereby an accurate movement is interrupted.

Furthermore, recently as represented by a semiconductor, it has been requested to extremely limit an amount of dust to be attached to an electronic part or the like. A driving mechanism capable of completely preventing dust from being generated is ideally desired.

To decrease the amount of dust, a transfer system of the non-contact transmission type is clearly preferable. Various systems have been proposed so far as the transfer system of the non-contact transmission type. Among the proposed systems, a system using the action of electromagnetic coupling (hereafter referred to as "a magnetic transfer system") has a relatively simple structure. A linear transfer mechanism constituted by combining a spiral magnetic circuit with an magnetic electrode has been recently proposed as the magnetic transfer system (official gazette of U.S. Pat. No. 5,377,816). Moreover, a magnetic screw used as a feeder is proposed as an art indirectly related to the magnetic transfer system in the field of machining tools or the like (official gazette of Japanese Patent Application Laid-Open No. 7-280060).

The above official gazette of U.S. Pat. No. 5,377,816 discloses a mechanism for generating a linear motion by using a spiral magnet. That is, the mechanism comprises a cylindrical body to be rotated by a motor, on which many magnet pieces of N and S poles are alternately arranged so as to form a spiral layout and a base member movably arranged closely to the cylindrical body in its axial direction and provided with a magnet segment, and which is constituted so that the base member linearly moves by magnetic attraction the magnet pieces and the magnet segment when the cylindrical body rotates.

Moreover, the above official gazette of Japanese patent Laid-Open No. 7-280060 discloses a magnetic screw. The magnetic screw comprises a screw shaft which is made of a magnetic material and on whose surface a thread is spirally formed and a cylindrical nut body arranged on the outer periphery of the screw shaft at an interval and provided with a spirally-polarized magnetic pole on the inner periphery correspondingly to the thread. When the screw shaft rotates, the cylindrical nut body moves in the axial direction of the screw shaft.

According to the above-described general magnetic transfer system, a contact portion related to a transfer mechanism in a vacuum device is usually only a roller section for supporting a movable body (a carrier or tray; hereafter referred to as "carrier") and a contact portion is absent at the driving-force transmission section for moving the carrier. Therefore, it is possible to eliminate the contact portion causing dust to be generated. Therefore, the magnetic transfer system is able to moderate the problems of abrasion and dust generation compared to the contact transmission system and has an ideal structure as the internal transfer mechanism of the vacuum device.

Because the above-described magnetic transfer system generally has only a small thrust which is obtained from the magnetic coupling action of a magnetic coupling section, it is requested to form many magnetic coupling sections. In this case, the "magnetic coupling section" denotes a section in which magnetic poles are coupled with each other because a magnetic force works a driving section and a driven section. Therefore, in the case of a magnetic transfer system comprising a columnar rotational driving section with a spiral magnet portion formed on its surface (hereafter referred to as "driving shaft") and a movable body provided with magnets arranged at an interval of the same distance as the pitch of the spiral magnet portion, the number of magnetic coupling sections is increased by increasing the length of the driving shaft in the transfer direction (axial direction) and increasing the number of turns of the spiral magnet portion and the number of magnets of the movable body.

For example, a case is considered in which the above magnetic transfer system is applied to a semiconductor fabrication equipment including a plurality of vacuum process chambers connected in series. The chambers are separated from each other by a gate valve. Therefore, when using the magnetic transfer system as a system for transferring the carrier for mounting a substrate, it is a matter of course that the above driving shaft is provided for each chamber so as to move the carrier by rotating each driving shaft. The carrier is transferred through each chamber in order in accordance with a predetermined substrate processing procedure. In this case, the carrier is constituted so that it is delivered the driving shafts of the chambers while it is moved the adjacent chambers.

The conventional magnetic transfer system having the above structure has the following problems.

Because the chambers are separated from each other by the gate valve, a gap is present the driving shafts and therefore, a crossing portion is formed for the carrier to be transferred. Therefore, to smoothly move the carrier, it is necessary to match magnetic circuits driving shafts at the crossing portion. Unless properly performing the matching, the carrier cannot be smoothly moved. Moreover, if repulsion occurs in carrier delivery at the crossing portion, not only a purposed thrust is not produced but also transfer may stop.

Therefore, to smoothly move the carrier driving shafts, it is desired to synchronize the rotations of the driving shafts.

As a simple structure for realizing the synchronization, it is considered to rotate all the driving shafts of each chamber by a motor. However, because this structure has a large problem that the load excessively increases, it cannot be practically used. Then, it is considered to perform the control for synchronization the driving shafts by providing motors which rotate the driving shafts for each chamber and synchronously controlling the operation of each motor. In the case of this synchronous control, however, it is practically very difficult to align the positions of a plurality of magnetic poles arranged on the carrier with the position of the spiral magnet portion of the driving shaft when delivering the carrier the chambers because the stop position of the object to be processed is independently set for each chamber and dimensional errors of the chambers or errors in assembling the semiconductor fabrication equipment are present.

As described above, in the case of the conventional semiconductor fabrication equipment provided with a plurality of vaccum process chambers connected in series and providing a driving shaft for each chamber so that it rotates in an independent driving system, it is difficult to perform the control for aligning the position of the magnetic pole arranged to the carrier with the position of the next driving shaft when delivering the carrier from the driving shaft of each chamber to the driving shaft of adjacent other chamber.

The above problems are not included in the above-described documents of prior art. Therefore, the problems cannot be solved by the magnetic feed mechanism or magnetic screw shown in these documents.

SUMMARY OF THE INVENTION

The present invention is made to solve the above problems and its object is to provide a magnetic transfer system used to transfer a carrier in a semiconductor fabrication equipment provided with a plurality of process chambers connected in series, having a structure in which carrier-feed driving shafts to be driven independently of each other is provided for each chamber, and capable of smoothly delivering the carrier chambers and moreover performing smooth transfer and continuous transfer without using a synchronous control mechanism.

It is another object of the present invention to provide a power transmission mechanism of the above magnetic transfer system capable of solving the above problems and moreover, arranging a section for transmitting power to the carrier-feed driving shaft to an optimum position by using a space and thereby reducing the restrictions on arrangement layout.

It is still another object of the present invention to provide a rotational driving member suited to realize the above magnetic transfer system and having a simple structure.

To achieve the above objects, a magnetic transfer system of the present invention is constituted as described below.

A magnetic transfer system is provided with a transfer route for transferring a movable body (including a carrier, slider, and object to be processed) by passing through at least two chambers, a crossing portion is formed between the chambers in the transfer route, and a drive section (drive and rotational driving member or driving shaft) for moving the movable body correspondingly to each chamber is independently provided for each chamber. The two chambers are normally separated from each other and connected with each other at a proper timing by opening a coupling section (partition valve or gate valve). Therefore, in the above transfer route, a gap portion, that is, the crossing portion is formed between the two chambers. When the rotational driving member or the driving shaft of each chamber rotates, the movable body (carrier provided with slider having magnetic coupling section) is attracted and transferred along the transfer route in accordance with the magnetic coupling action with the rotational driving member. When the movable body moves from a chamber to another chamber, the coupling section is opened and the movable body moves on the above crossing portion. The rotational driving member is divided into at least two portions in its axial direction, and a first divided portion (corresponding to the fixed driving shaft of embodiments) and a second divided portion (corresponding to the movable driving shaft of the embodiments) are formed. The first divided portion is secured to a shaft core member. Moreover, the second divided portion is set to the shaft core member so that it is limited in its rotational direction but it freely moves in its axial direction at a certain width (predetermined range set as a play). At least one pair of spiral magnetic coupling sections are formed on the surface of each of the first and second divided portions under the same condition (specifically, at the same pitch). The spiral magnetic coupling sections tend to couple with the magnetic coupling section of the nearby movable body due to magnetic attraction. The movable body, that is, the carrier provided with a slider having a magnetic coupling section and mounting an object to be processed is movably set onto the transfer route so as to pass through a place a certain distance separate from the surface of the rotational driving member on which a spiral magnetic coupling section is formed and a magnetic coupling section is provided for a part facing the surface of the above rotational driving member at an interval of the distance equal to the pitch in the spiral magnetic coupling section. By rotating the rotational driving member by a drive such as a motor, the movable body linearly moves along the transfer route.

The above magnetic transfer system uses the first divided portion as a driving shaft for feeding the movable body and controlling the position of the movable body in a chamber and the second divided portion as a driving shaft for performing matching (pitch adjustment) when delivering the movable body adjacent rotational driving members provided for each chamber. Therefore, when delivering the movable body from the rotational driving member of a certain chamber to that of other chamber, in other words, when transferring the movable body through the above crossing portion, it is unnecessary to control the movement of the body between rotational driving members by special control means, and it is possible to simply and accurately perform the above matching in accordance with the mechanical characteristic of a rotational driving member comprising the fixed driving shaft which is the first divided portion and the movable driving shaft which is the second divided portion, and simplify the control for delivery from a certain rotational driving member to the next rotational driving member.

In the above structure, it is preferable that the second divided portion is connected to the shaft core member through a key, pressed against the first divided portion by a coil spring, and positioned by a stopper formed on the shaft core member. According to this structure, the second divided portion is set to a position closest to the first divided portion unless it receives a force from the outside and the positional relation between the first and second divided portions is kept constant.

Moreover, it is preferable that the second divided portion and the shaft core member are connected to each other by a spline structure in general.

Furthermore, in the above structure, it is preferable that the spiral magnetic coupling section of the rotational driving member has a magnet arrangement in which N and S poles are alternately arranged and the magnetic coupling section of the movable body is made of a material with a high magnetic permeability. Furthermore, it is preferable that the spiral magnetic coupling section of the rotational driving member is constituted with a ferromagnetic material and the magnetic coupling section of the movable body has a magnet arrangement in which N and S poles are alternately arranged.

Furthermore, it is preferable that the rotational driving member is constituted so that the rotational driving member is regarded as one rotational driving member including the gap between the first and second divided portions when the second divided portion is located at a position closest to the first divided portion within a certain width and the spiral magnetic coupling section is continuously formed. Though the rotational driving member is divided into the fixed driving shaft and the movable driving shaft, it is possible to accurately, easily, and continuously form the spiral magnetic coupling section on each of the fixed driving shaft and the movable driving shaft.

Furthermore, in the above structure, it is preferable that the movable range of the second divided portion is equal to or larger than the above pitch and two times or less than the pitch. For the second divided portion to smoothly deliver the movable body, it is preferable that the second divided portion has a play equivalent to the above range.

Furthermore, in the above structure, it is preferable that the rotational driving member is arranged at the atmospheric side and the movable body is set to a place isolated from the atmosphere. Thereby, it is possible to prevent the dust produced at the rotational driving member from affecting the substrate of the movable body. Furthermore, it is preferable that the magnetic transfer system is constituted so that the portion isolated from the atmosphere is brought under a vacuum state.

A power transmission section for transmitting power from a drive to the rotational driving member is provided for the gap between the first and second divided portions. It is preferable that the power transmission section is constituted with a bevel gear mechanism.

The above magnetic transfer system conventionally comprises a plurality of chambers connected in series, in which the rotational driving member is individually provided for each chamber so that the rotational driving member independently operates, the cross portion is formed between the rotational driving members by the partition valve, and each rotational driving member is divided into two portions such as a fixed driving shaft for positioning and feed (first divided portion) and a movable driving shaft for delivery (second divided portion). Therefore, when the movable body moves through the crossing portion, it is possible to achieve smooth movement of the movable body at the crossing portion with a simple structure and at a low cost without using a complex mechanism for synchronous control and thus, realize secure movement of the movable body.

To achieve the above object, a power transmission mechanism of the present invention is constituted as described below.

The power transmission mechanism is applied to a magnetic transfer system constituted with a movable body comprising a rotational driving member provided for each chamber or a driving shaft, a carrier and a slider moving along a transfer route provided for each chamber, and an object to be processed. The rotational driving member is divided into at least two portions in the axial direction to form the first divided portion and the second divided portion. The first divided portion is secured to a shaft core member and the second divided portion is set to the shaft core member so that it is limited in the rotational direction but it freely moves in the axial direction at a certain width. At least one pair of spiral magnetic coupling sections are formed on the surface of each of the first and second divided portions under the same condition. The movable body is movably provided so as to pass through a place a certain distance separate from the surface of a rotational driving member on which the spiral magnetic coupling section is formed and a magnetic coupling section is provided for a part facing the above surface of the rotational driving member at an interval of the distance same as the pitch in the spiral magnetic coupling section. A power transmission section is provided between the first and second divided portions in the rotational driving member. The power from the drive is supplied to the rotational driving member through the power transmission section to linearly move the movable body by rotating the rotational driving member.

The above power transmission mechanism uses the first divided portion as a driving shaft for feed and position control of the movable body and the second divided portion as a driving shaft for performing matching when delivering the movable body between the rotational driving members. Therefore, when delivering the movable body from the rotational driving member of a certain chamber to that of another chamber, it is unnecessary to control the movement of the movable body between the rotational driving members by special control means and it is possible to perform the above matching in accordance with the mechanical characteristic of a rotational driving member comprising the fixed driving shaft which is the first divided portion and the movable driving shaft which is the second divided portion and thus, the control for delivering the movable body from a certain rotational driving member to the next rotational driving member is simplified. Particularly, it is possible to reduce the restrictions on the layout for setting components by setting the power transmission mechanism between the first and second divided portions serving as rotational driving members.

Also in the case of the power transmission mechanism, it is preferable that the second divided portion is connected to the shaft core member through a key and pressed against the first divided portion side by a coil spring and moreover, positioned by a stopper formed on the shaft core member. Furthermore, it is preferable that the second divided portion and the shaft core member are connected to each other by a spline structure in general.

Moreover, for the power transmission mechanism, it is preferable that the spiral magnetic coupling section of a rotational driving member has a magnet arrangement in which N and S poles are alternately arranged and the magnetic coupling section of the movable body is made of a material with a high magnetic permeability. Furthermore, it is preferable that the spiral magnetic coupling section of a rotational driving member is made of a ferromagnetic material and the magnetic coupling section of the movable body has a magnet arrangement in which N and S poles are alternately arranged. The second divided portion is constituted so that the movable range is equal to or more than the pitch and two times or less than the pitch.

It is preferable that the power transmission section of the power transmission mechanism comprises a bevel gear mechanism.

It is preferable that the rotational driving members and power transmission section of the power transmission mechanism are arranged in a chamber covered with partitions and isolated from a space in which the movable body is present. The rotational driving members are arranged at the atmospheric side and the movable body is set to a place isolated from the atmosphere. Moreover, the power transmission mechanism is constituted so that the place isolated from the atmosphere is brought under a vacuum state.

In the case of the power transmission mechanism of the above magnetic transfer system, a power transmission section is set to the space between the first and second divided portions of the rotational driving member. Therefore, it is possible to effectively use the space, make the system compact, and reduce the restrictions on the layout.

A rotational driving member of the present invention is constituted as described below in order to achieve the above object.

The rotational driving member is movably set in a certain linear direction so that it is separate from a movable body on whose facing side a magnetic coupling section is formed by a certain distance in parallel with a linear direction. In the case of the rotational driving member, a spiral magnetic coupling section is formed on the surface of the rotational driving member so that the spiral magnetic coupling section and the movable body are attracted by each other. When the rotational driving member rotates, the movable body nearby the member moves linearly. The rotational driving member is divided into at least two portions in the axial direction and thereby, provided with the first divided portion and the second divided portion. The first divided portion is secured to a shaft core member and the second divided portion is set to the shaft core member so that it is limited in the rotational direction but it freely moves in the axial direction at a certain width. At least one pair of spiral magnetic coupling sections are formed on the surface of each of the first and second divided portions under the same condition.

Also in the above structure, it is preferable that the second divided portion is connected to the shaft core member through a key, pressed against the first divided portion side by a coil spring, and positioned by a stopper formed on the shaft core member. According to this structure, the second divided portion is set to a position closest to the first divided portion as long as it does not receive an external force and the positional relation between the first and second divided portions is kept constant.

Moreover, it is preferable that the second divided portion and the shaft core member are connected by a spline structure in general.

Furthermore, in the above structure, it is preferable that the spiral magnetic coupling section of a rotational driving member has a magnet arrangement in which N and S poles are alternately arranged and the magnetic coupling section of a movable body is made of a material with a high magnetic permeability. Furthermore, it is preferable that the spiral magnetic coupling section of a rotational driving member is made of a ferromagnetic material and the magnetic coupling section of the movable body has a magnet arrangement in which N and S poles are alternately arranged.

Furthermore, it is preferable that a rotational driving member is constituted so that it is regarded as one rotational driving member including the gap between the first and second divided portions when the second divided portion is located at a position closest to the first divided portion within a certain width and a spiral magnetic coupling section is continuously formed. Though the rotational driving member is divided into the fixed driving shaft and the movable driving shaft, it is possible to accurately, easily, and continuously form a spiral magnetic coupling section on the fixed driving shaft and the movable driving shaft respectively.

In the above structure, a power transmission section for transmitting power supplied from a drive is set between the first and second divided portions. It is preferable to constitute the power transmission section with a bevel gear mechanism.

The above rotational driving member serves as a component useful to manufacture the above magnetic transfer system or power transmission mechanism and supports the possibility for realizing the transfer system.

Moreover, in the case of the above magnetic transfer system, it is not always necessary to divide the rotational driving member of the drive into a fixed driving shaft and a movable driving shaft but it is possible to form the rotational driving member like one rod. That is, it is possible to constitute the magnetic transfer system so that the rotational driving member is formed like one rod, connected to a shaft core member through a key, pressed against one side by a coil spring, and positioned by a stopper formed on the shaft core member, and thereby set to the shaft core member so that it is limited in the rotational direction but it freely moves at a certain width and moreover, at least one pair of spiral magnetic coupling sections are formed on the surface under the same condition. As long as a movable body is not continuously transferred, it is possible to smoothly transfer the movable body between chambers while adjusting the phase even in the case of a magnetic transfer system having the above structure.

DETAILED DESCRIPTION OF THE PREFERRED EMBODIMENTS

The preferred embodiment of the present invention is described below by referring to the accompanying drawings.

A magnetic transfer system of the present invention is, for example applied to a vacuum process system for processing a thin film deposited on a substrate and used as a mechanism for moving a substrate mounting carrier (substrate tray). For this embodiment, a case is described in which the present invention is applied to a load-lock-type vacuum process system constituted by connecting a plurality of vacuum process chambers in series.

Figure 1:
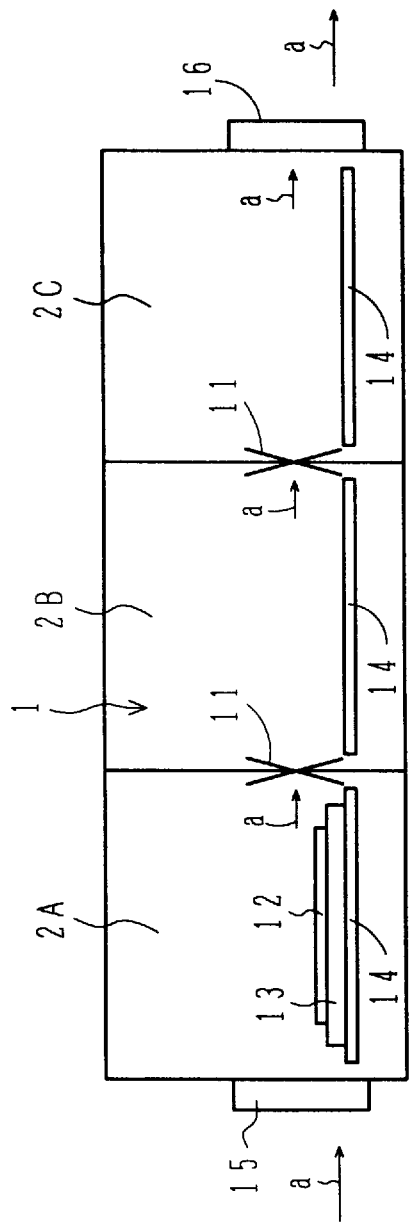
FIG. 1 is an illustration conceptually showing the entire structure of a load-lock-type vacuum process system to which a magnetic transfer system of the present invention is applied.

In FIG. 1, a vacuum process system 1 is provided with, for example, three chambers (partition chambers) 2A, 2B, and 2C and a partition valve 11 is arranged between the chambers. The number of chambers is not limited to 3. The inside of each of the chambers 2A, 2B, and 2C is a space decompressed to have a high vacuum degree and the chambers are isolated from each other by the partition valve 11 to form the closed vacuum process chamber. When the partition valve 11 is opened, the chambers communicate with each other. In the chambers 2A, 2B, and 2C, predetermined different process are applied to an object to be processed (e.g. substrate) brought in through the opened partition valve 11. As the partition valve 11, for example, a gate valve is used. A carrier 13 mounting an object 12 to be processed such as a substrate is successively transferred to the chambers 2A, 2B, and 2C connected in series through the partition valve 11. The object 12 to be processed supplied into the chamber is stopped at a predetermined position for process in each chamber.

Figure 2:
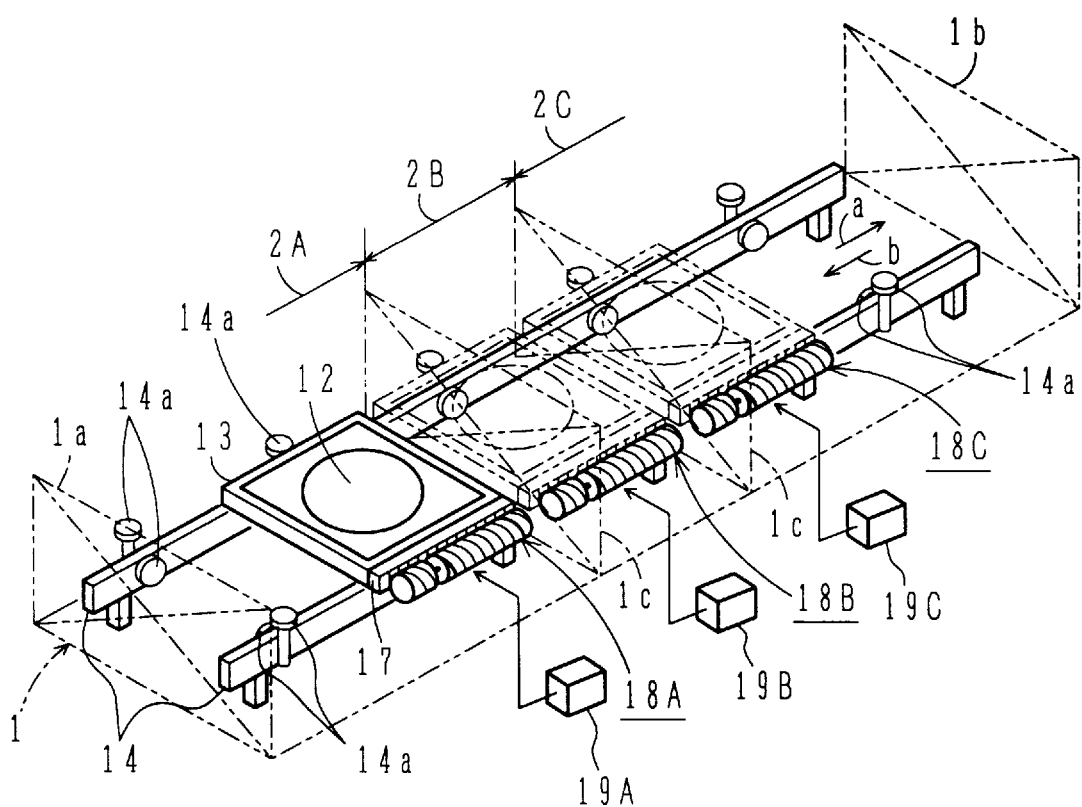
FIG. 2 is a perspective view showing the internal structure of the vacuum process system.

The carrier 13 mounting the object 12 to be processed is set on a pair of guide rods 14 provided at the lower side and moves along the guide rods 14. Two guide rods 14 are arranged in parallel under the carrier 13 as shown in FIG. 2, which have a linear raillike shape. A plurality of rollers 14a for supporting the carrier 13 are provided for predetermined lateral and lower portions of each of two guide rods 14 at a constant interval. According to the above structure, the carrier 13 mounted on the guide rods 14 to move is linearly transferred.

The guide rod 14 is discontinuous because a part of the rod 14 is cut at a portion for which the partition valve 11 is provided, and separated for each chamber. Moreover, a drive such as a motor (not illustrated in FIG. 1) for moving the carrier 13 is individually provided for each of the chambers 2A, 2B, and 2C.

The carrier 13 first enters the chamber 2A through the inlet 15 of the chamber 2A, then passes through the partition valve 11 to be opened at a proper timing, and it is successively sent to the chambers 2B and 2C. In each chamber, a predetermined process is applied to the object 12 to be processed on the carrier 13 which is stopped. Finally, the carrier 13 is taken to the outside from an outlet 16 of the chamber 2C. An arrow "a" shows the moving state of the carrier 13 and the object 12 to be processed in the vacuum process system 1.

FIG. 2 shows the carrier 13 moving on two guide rods 14 arranged in parallel. The object 12 to be processed is mounted on the carrier 13. When the carrier 13 receives a driving force for movement, it moves by being supported and guided by the guide rod 14 provided with a roller 14a. A slider 17 is secured to, for example, the lateral of the carrier 13. The slider 17 has a magnetic coupling section 21 (shown in FIG. 4) to be described later, which is formed on the outer surface of the slider 17 in parallel with the guide rod 14. The slider 17 linearly slides by receiving a driving force from the magnetic coupling section of a rotational driving member to be described later. Therefore, slider 17 is referred to as a slider. When the slider 17 moves, the carrier 13 integrated with the slider 17 also moves. Therefore, the carrier 13 moves by receiving a magnetic driving force from the rotational driving member.

Rotational driving members (hereafter referred to as "driving shafts") 18A, 18B, and 18C for supplying a driving force for linearly moving the carrier 13 provided with the slider 17 are arranged on three chambers 2A, 2B, and 2C along the guide rod 14. Each driving shaft is columnar or cylindrical and journaled so as to be rotatable about the axis and moreover, it receives power(the driving force) from drives 19A, 19B, and 19C of a motor or the like and rotates in the normal or reverse directions. Details of a mechanism for transmitting power from drives 19A to 19C to the rotational driving members 18A to 18C are described later. A drive is provided for each chamber but synchronous control is not applied between the drives, and the driving shafts 18A to 18C of the chambers 2A to 2C are constituted so as to rotate independently.

The driving shafts 18A to 18C are arranged nearby the slider 17 of the carrier 13 so as to face the slider 17 when the carrier 13 is brought into a corresponding chamber.

Moreover, because the chambers are partitioned by the partition valve 11, driving shafts are also partitioned by the partition valve 11. Therefore, a gap is produced between adjacent driving shafts. The distance (L) of the gap (hereafter referred to as "a crossing portion") between the driving shafts is set to a value small enough compared to the length of the carrier 13. Because the crossing portion is present, matching of a magnetic circuit between the driving shafts becomes an issue when moving the carrier from a certain driving shaft to the next other driving shaft. This embodiment solves the problem by the following structure.

In the vacuum process system 1 shown in FIG. 2, a reference numeral 1a denotes a front wall for which the inlet 15 is provided, 1b denotes a rear wall for which the outlet 16 is provided, and 1c denotes a partition for which the partition valve 11 is provided. Moreover, in the case of the chamber 2A, the carrier 13, slider 17, and object 12 to be processed are drawn by continuous lines to show that the carrier 13 or the like is present in the chamber 2A. In the case of the chambers 2B and 2C, the carrier 13 or the like are shown by imaginary lines to show the state in which the carrier 13 presents in the chamber 2A is transferred to the chambers 2B and 2C in order. The object 12 to be processed is positioned for each chamber. Moreover, it is possible to constitute the vacuum process system 1 so that continuous transfer of the objects to be processed is performed, the object 12 to be processed is present in each of the chambers 2A to 2C, and the object to be processed is treated in each chamber.

Figure 3:
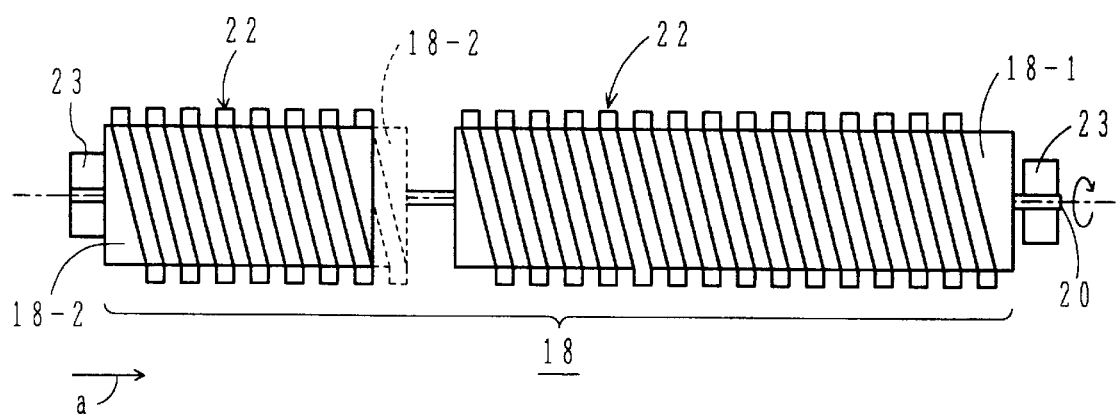
FIG. 3 is a front view of a driving shaft.

Then, the structures and functions of various portions of the driving shafts 18A to 18C are described below by referring to FIG. 3. In FIG. 3, a driving shaft 18 having the same structure as that of each of the driving shafts 18A to 18C is typically enlarged and shown and description is performed in accordance with the driving shaft 18. However, a mechanism for transmitting the driving force from a motor or the like to the driving shaft 18 is not illustrated.

The driving shaft 18 is divided into two portions in its axial direction such as a fixed driving shaft 18-1 located at the carrier forwarding side (right side in FIG. 3) and a movable driving shaft 18-2 located at the carrier incoming side. The fixed driving shaft 18-1 is secured to a common shaft core portion 20. The both ends of the shaft core portion 20 are rotatably supported by a support portion (rotary bearing) 23 respectively. The fixed driving shaft 18-1 has a function for moving the carrier 13 in a desired direction (direction a or b) in accordance with the magnetic coupling action between the shaft 18-1 and the slider 17 and a function for setting a stop position of the carrier 13 in a corresponding chamber. The movable driving shaft 18-2 is constituted so that it is secured to the shaft core portion 20 in order to limit the movement of it in its rotational direction and it is freely movable in a certain range with a play in the direction same as the travelling direction (direction a) of the carrier 13. It is a matter of course that the movable driving shaft 18-2 moved to the right side can also move to the left side. The movable driving shaft 18-2 is given a rotational operation same as that of the fixed driving shaft 18-1 from the shaft core portion 20 and is able to freely move in the range of the play in its axial direction in accordance with the movement of the carrier 13 in its travelling direction. In FIG. 3, the right end of the movable driving shaft 18-2 moved from the left side to the right side is shown by a broken line. It is preferable that the movable distance of the movable driving shaft 18-2 in its axial direction is included in a range of a distance equivalent to the pitch of a magnetic circuit to be mentioned later or more but two times or less than the pitch. The movable distance of the movable driving shaft 18-2 in its axial direction is determined as described above in order to positionally perform matching (a positional adjustment) at the above cross portion with a minimum moving distance.

Figure 16:
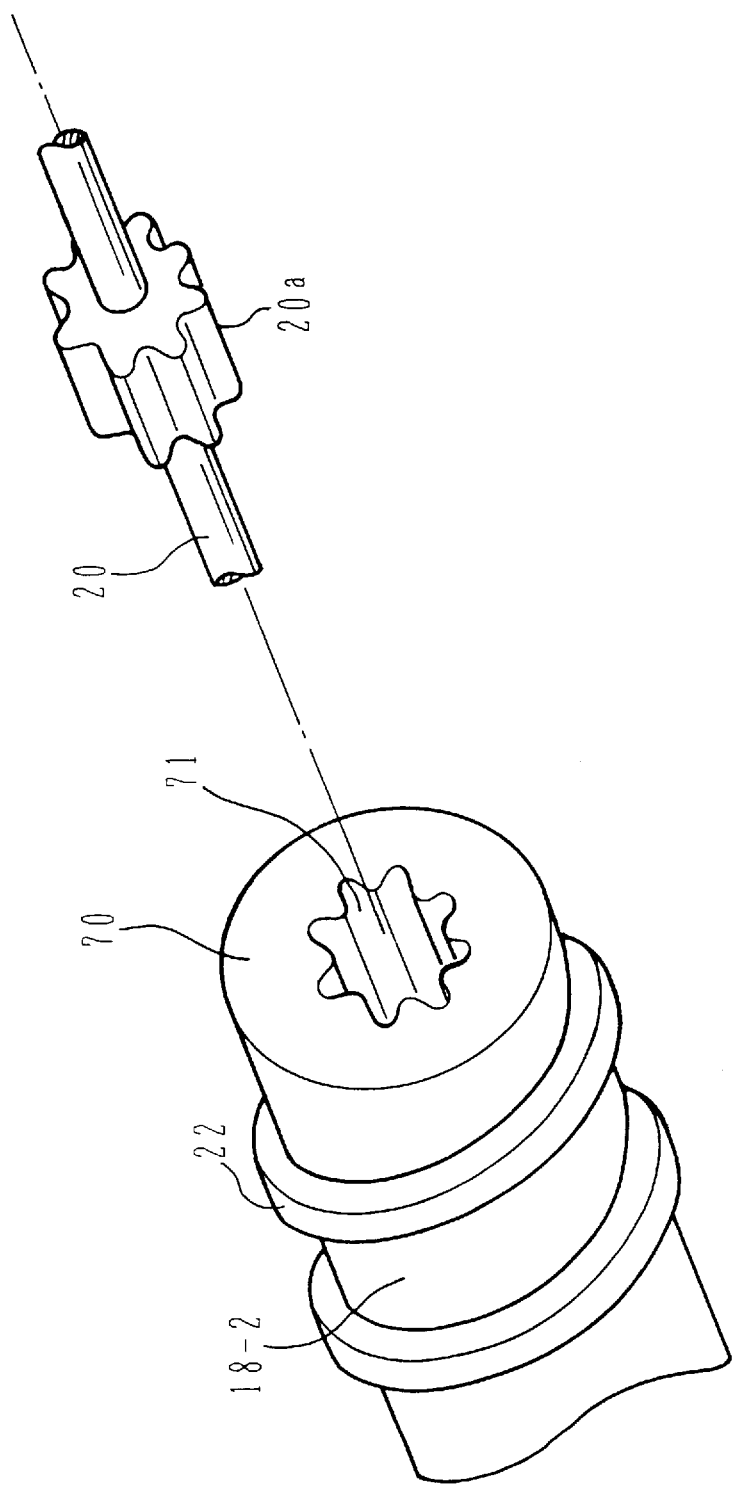
FIG. 16 is an illustration showing an essential portion of a spline structure which is an example of connection between a movable driving shaft and a shaft core portion.

To produce the above action, the movable driving shaft 18-2 and the shaft core portion 20 are connected each other by, for example, a well-known spline structure. FIG. 16 shows an essential portion of the spline structure. In the case of the illustrated spline structure, the shaft core portion 20 has a spline tooth 20a and serves as a spline shaft and the movable driving shaft 18-2 has a hole 71 engaging with the spline tooth 20a and serves as a boss. The hole 71 is formed so that the length of the hole 71 in its axial direction becomes larger than the width of the spline tooth 20a. It is possible to set the moving range of the movable driving shaft 18-2 in its axial direction according to the length of the hole 71 in its axial direction.

Moreover, for the relation between the movable driving shaft 18-2 and the shaft core portion 20, it is possible to provide a limit portion (or securing portion or the like; not illustrated) for limiting the axial-directional movement of the movable driving shaft 18-2 within the range of the above play for the shaft core portion 20 or movable driving shaft 18-2.

Furthermore, another specific structure between the movable driving shaft 18-2 and the shaft core portion 20 is described later by referring to FIGS. 10 and 11.

The surface of the driving shaft 18 (surface of each of the fixed driving shaft 18-1 and movable driving shaft 18-2) is provided with a magnetic coupling section 22 spirally formed at a preferable pitch. The magnetic coupling section 22 is shown as a spiral projection formed on the surface of the driving shaft in the case of the illustration. It is preferable that the magnetic coupling section 22 is a spiral magnet on whose outer surface a magnetic pole is formed. Moreover, it is preferable that the spiral magnet has a double spiral structure and N and S poles are alternately arranged. In regard to the magnetic coupling section 22, it is also possible to form N and S magnetic poles by spirally polarizing the surface of the driving shaft 18. In the case of the latter, no protrusion is formed on the surface of the driving shaft 18.

The magnetic coupling section 22 of the driving shaft 18 serves as a section to be combined with a magnetic coupling section 21 provided for the slider 17 because a magnetic force works between the sections 18 and 21. The magnetic coupling section 21 of the slider 17 is also formed by the above magnet or polarization. The shaft core portion 20 of the driving shaft 18 is parallel with the slider 17 and arranged so that a proper gap realizing magnetic coupling between the portion 20 and the slider 17 is formed.

Figure 4:
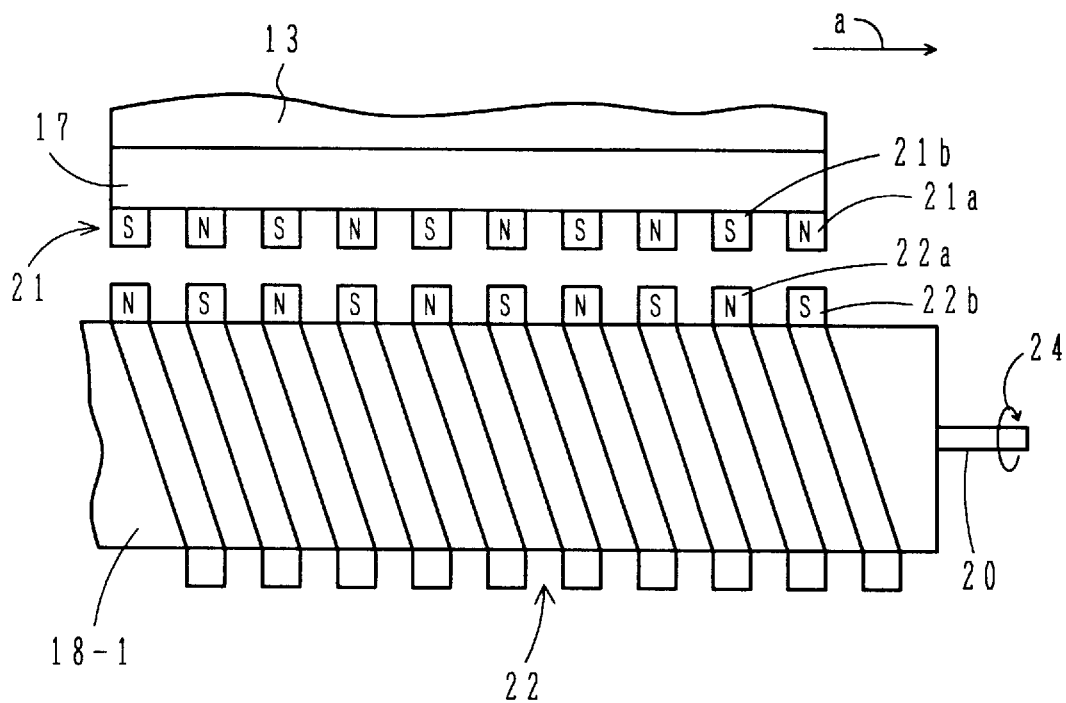
FIG. 4 is a top view showing the relation between a fixed driving shaft and a slider.

Moreover, the relation between the fixed driving shaft 18-1 and the carrier 13 including the slider 17 is described below by referring to FIG. 4. FIG. 4 is a local top view in which movable driving shafts, the whole of the carrier 13, and the guide rod 14 are not illustrated. The surface of the fixed driving shaft 18-1 is spirally provided with N-pole magnet 22a and an S-pole magnet 22b. The fixed driving shaft 18-1 and the carrier 13 are magnetically coupled by the magnetic coupling section 21 provided for the slider 17 added to the carrier 13 and the magnets 22a and 22b on the fixed driving shaft 18-1. It is preferable that the magnetic coupling section 21 is formed with rodlike magnets arranged in parallel and moreover constituted with the N-pole magnet 21a and S-pole magnet 21b correspondingly to the magnets 22a and 22b. The arrangement interval between the magnets 21a and 21b is almost equal to the interval (pitch) between the spiral magnets 22a and 22b. As shown in FIG. 4, different poles are faced and magnetically attracted and coupled each other between the magnetic coupling section 22 of the fixed driving shaft 18-1 and the magnetic coupling section 21 of the slider 17. Thus, magnetic circuits are formed at a attracting and coupling portions and arranged at a predetermined pitch. The magnets 21a and 21b and the magnets 22a and 22b are provided in order to form the magnetic circuit for magnetically coupling the fixed driving shaft 18-1 with the slider 17. However, by using either of a ferromagnetic material and high-magnetic-permeability material both of which show the same characteristic, it is possible to constitute the same magnetic circuit. As shown in FIG. 4, by rotating the shaft core portion 20 in a counterclockwise rotational direction 24 toward the travelling direction a, the magnetically-coupled slider 17 moves in the travelling direction a (rightward in FIG. 4). Therefore, the carrier 13 integrated with the slider 17 also moves together.

As described above, when the fixed driving shaft 18-1 rotates in any direction, the slider 17 is attracted and induced in accordance with the magnetic coupling action between the spiral magnetic coupling section 22 of the fixed driving shaft 18-1 and the magnetic coupling section 21 of the slider 17, and linearly moves in the travelling direction (e.g. direction a) under a non-contact state, and thereby the carrier 13 integrated with the slider 17 also moves in the same direction. Moreover, by reversing the fixed driving shaft 18-1, the carrier 13 moves in the opposite direction (direction b).

Though the structure of the fixed driving shaft 18-1 is described in FIG. 4, a magnetic coupling section 22 same as that of the fixed driving shaft 18-1 is also provided for the surface of the movable driving shaft 18-2. When the movable driving shaft 18-2 and the slider 17 have a stable magnetic coupling relation and the movable driving shaft 18-2 rotates about its axis, the movable driving shaft 18-2 shows a function of linearly moving the slider 17, which is the same as the function of the fixed driving shaft 18-1.

For the driving shaft 18 having the above structure, the carrier delivery at the crossing portion is specifically described below by referring to FIGS. 5a to 5d. FIGS. 5a to 5d show a case in which two adjacent driving shafts 18A and 18B are arranged in series through a crossing portion with a distance L. While the carrier 13 is delivered from the driving shaft 18A to the driving shaft 18B, the partition valve 11 (not illustrated in FIGS. 5a to 5d) between the chambers 2A and 2B is opened. In the operations of the driving shafts 18A and 18B, their fixed driving shaft has a function of determining the stop position of the carrier in the chamber for which the fixed driving shaft is provided and a function of sending the carrier to the next chamber and their movable driving shaft has a function of smoothly receiving the carrier sent from the preceding chamber and delivering it to the fixed driving shaft corresponding to the movable driving shaft. In FIGS. 5a to 5d, only the slider 17 is shown but the carrier 13 is not shown to simplify the illustration.

In FIGS. 5a to 5d, it is assumed that the slider 17 (the carrier 13) is sent from the left side to the right side. The shaft core portions of the driving shafts 18A and 18B are present on the same linear line. In the driving shafts 18A and 18B, reference symbols 18A-1 and 18B-1 denote the fixed driving shafts and 18A-2 and 18B-2 denote the movable driving shafts.

Figure 5A:
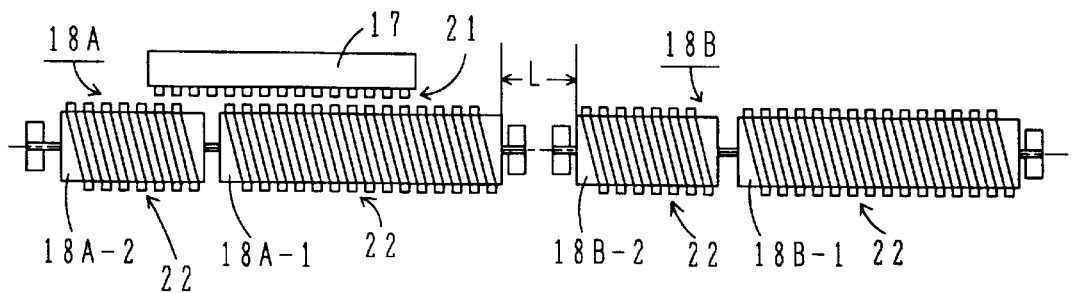
FIG. 5a is a top view showing the initial state of a carrier delivery between the driving shafts.

In FIG. 5a, the fixed driving shaft 18A-1 and movable driving shaft 18A-2 are magnetically coupled with the slider 17 and the slider 17 (and the carrier integrated with the slider 17; the same is true for the following) moves rightward when the fixed driving shaft 18A-1 and movable driving shaft 18A-2 rotate.

Figure 5B:
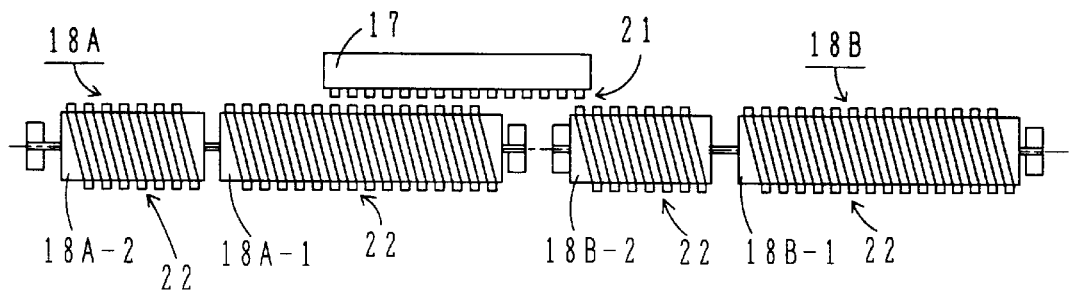
FIG. 5b is a top view showing the state immediately before the carrier delivery between the driving shafts.

In FIG. 5b, the slider 17 is further moved rightward by only the fixed driving shaft 18A-1 and the right end of the slider 17 exceeds the crossing portion and approaches the movable driving shaft 18B-2. When the right end of the slider 17 approaches the movable driving shaft 18B-2, the magnetic coupling section of the slider 17 is automatically aligned with the magnetic coupling section of the movable driving shaft 18B-2 because the movable driving shaft 18B-2 can move in the axial direction within a certain range and the slider 17 and the shaft 18B-2 are smoothly magnetically coupled each other. In other words, the movable driving shaft 18B-2 moves to a position most suitable to magnetically couple with the slider 17 and the matching (pitch adjustment) between the fixed driving shaft 18A-1 and the movable driving shaft 18B-2 is smoothly performed. That is, it is possible to easily match the driving shaft 18A with the driving shaft 18B.

Figure 5C:
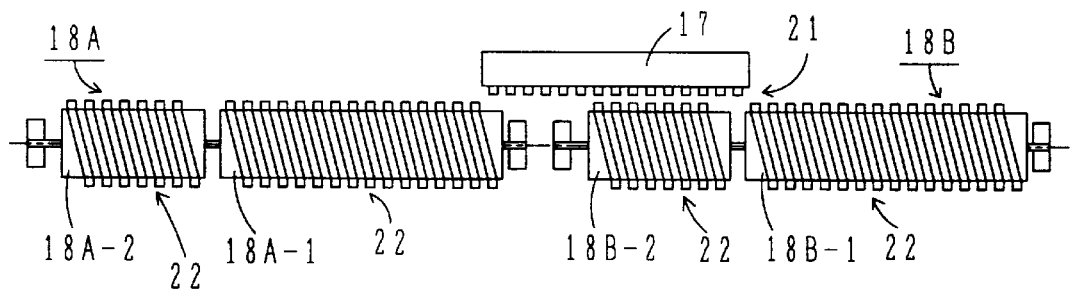
FIG. 5c is a top view showing the state immediately after the carrier delivery between the driving shafts.

In FIG. 5c, the slider 17 to be moved by the movable driving shaft 18B-2 is thereafter released from the magnetic coupling with the fixed driving shaft 18A-1 and starts the magnetic coupling with the fixed driving shaft 18B-1. When the magnetic coupling section of the slider 17 and that of the fixed driving shaft 18B-1 start their magnetic coupling, the movable driving shaft 18B-2 moves to an optimum position in the axial direction so that the magnetic coupling is smoothly performed. Thus, the movable driving shaft 18B-2 is matched (adjusted in pitch) with the fixed driving shaft 18B-1.

Figure 5D:
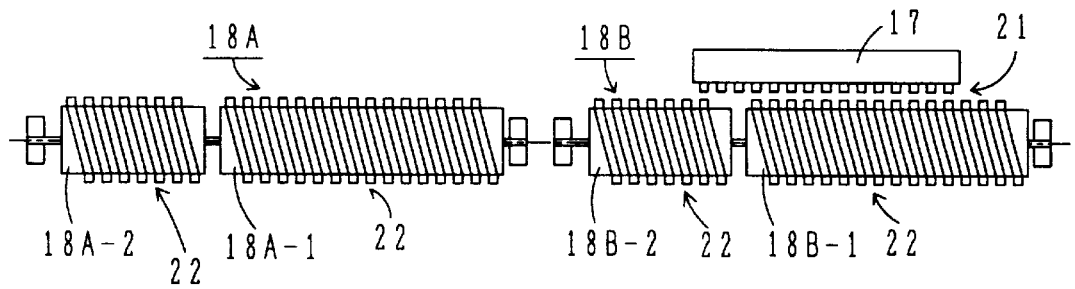
FIG. 5d is a top view showing the completed state of the carrier delivery between the driving shafts.

In FIG. 5d, the slider 17 is moved up to a predetermined position by the rotation of the fixed driving shaft 18B-1 and movable driving shaft 18B-2 and the state in which the slider 17 stops at the position is shown. The slider 17 stands still at this position and the object loaded on the carrier 13 is processed. When the process is performed, the chamber 2B is airtightly closed, decompressed, and brought under a desired vacuum state.

The state related to the positional relation in FIG. 5d is the same as the state in FIG. 5a. Thereafter, the carrier 13 is sent to the driving shaft 18C of the next chamber 2C by the driving shaft 18B. Also for this sending operation, the above described operations in FIGS. 5a to 5d are successively repeated.

In the case of a transfer mechanism, control for positioning an object to be transferred becomes an issue in general. In the case of this embodiment, however, because the position of a fixed driving shaft in the transfer direction is kept at a high accuracy, an effective-enough positional accuracy is secured by using the fixed driving shaft when a high positional accuracy is requested.

In the case of the above embodiment, the structure is shown in which the movable driving shaft is provided for the incoming side. However, it is also possible to provide the fixed driving shaft for the incoming side. Moreover, it is possible to provide the movable driving shaft for the both end sides of the fixed driving shaft.

The magnetic transfer system of the above embodiment is effective to transfer the carrier 13 mounting a substrate or the like of a semiconductor device but it is not always necessary that the environment is under a vacuum state. Moreover, in the case of the above embodiment, the carrier 13 is horizontally transferred by the raillike guide rod 14. However, the transfer condition is not always restricted to horizontal transfer or the support mechanism of the carrier 13 is not restricted to the illustrated mechanism.

Furthermore, in the case of the above embodiment, the driving shafts 18A to 18C are provided in a vacuum chamber same as the case of the carrier 13. However, it is also possible to provide the driving shafts in the atmospheric environment outside of the chamber. In this case, the magnetic coupling section 21 of the slider 17 and the magnetic coupling section 22 of each driving shaft are magnetically coupled each other through the wall of the chamber.

Then, a mechanism for transmitting power from the drives (19A to 19C) to the corresponding driving shafts (18A to 18C) is described below.

Figure 6:
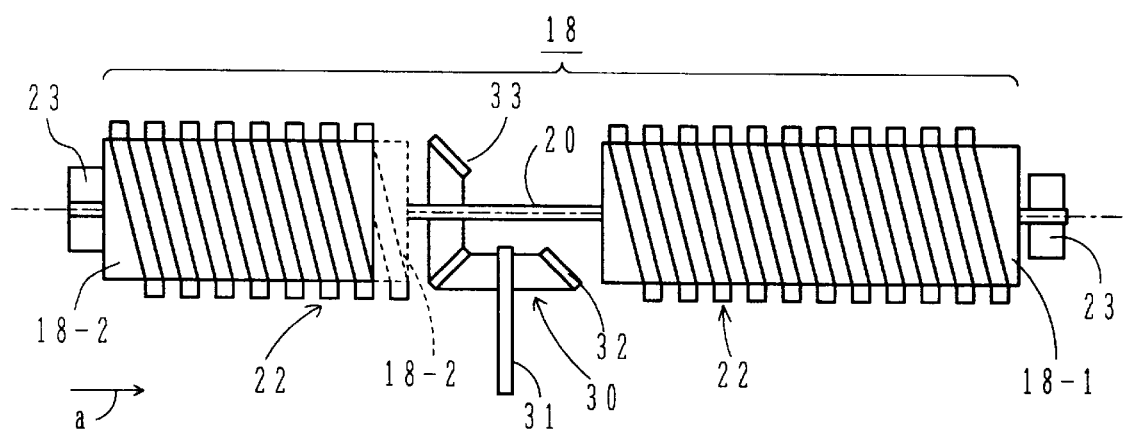
FIG. 6 is a top view of a driving shaft provided with a power transmission section.

FIG. 6 shows a driving shaft provided with a power transmission mechanism of the present invention, which is a drawing similar to the above described FIG. 3. In FIG. 6, components substantially same as the components described in FIG. 3 are provided with the same reference symbol and their detailed descriptions are omitted.

This power transmission mechanism includes the driving shaft 18 comprising the fixed driving shaft 18-1 and the movable driving shaft 18-2 which are two portions divided in the axial direction, in which the gap between the divided portions is formed slightly widely and a power transmission section 30 is set to the gap. The power transmission section 30 comprises a shaft portion 31 connected to the drive side, a bevel gear 32 coupled with the shaft portion 31, and a bevel gear 33 coupled with the shaft core portion 20. The rotational power given from the drive is transmitted to the shaft core portion 20 due to engagement between the bevel gears 32 and 33 and the shaft core portion 20 rotates.

In the driving shaft 18, an interval large enough to set the power transmission section 30 and an interval for the play for the movable driving shaft 18-2 to freely move in the axial direction are secured in the gap between the fixed driving shaft 18-1 and the movable driving shaft 18-2.

In the case of the above power transmission mechanism, it is possible to compactly set the power transmission mechanism and reduce the restrictions on the mechanism present in a conventional system because of arranging the mechanism by using the structure in which the driving shaft 18 (18A to 18C) is divided into two portions and using a space between the divided portions.

The above embodiment uses the mechanism of bevel gears as a power transmission mechanism. However, it is also possible to use other structure such as other type of gear mechanism, belt, or chain. When using a belt or chain, it is preferable to isolate its setting position from a vacuum environment.

Figure 7:
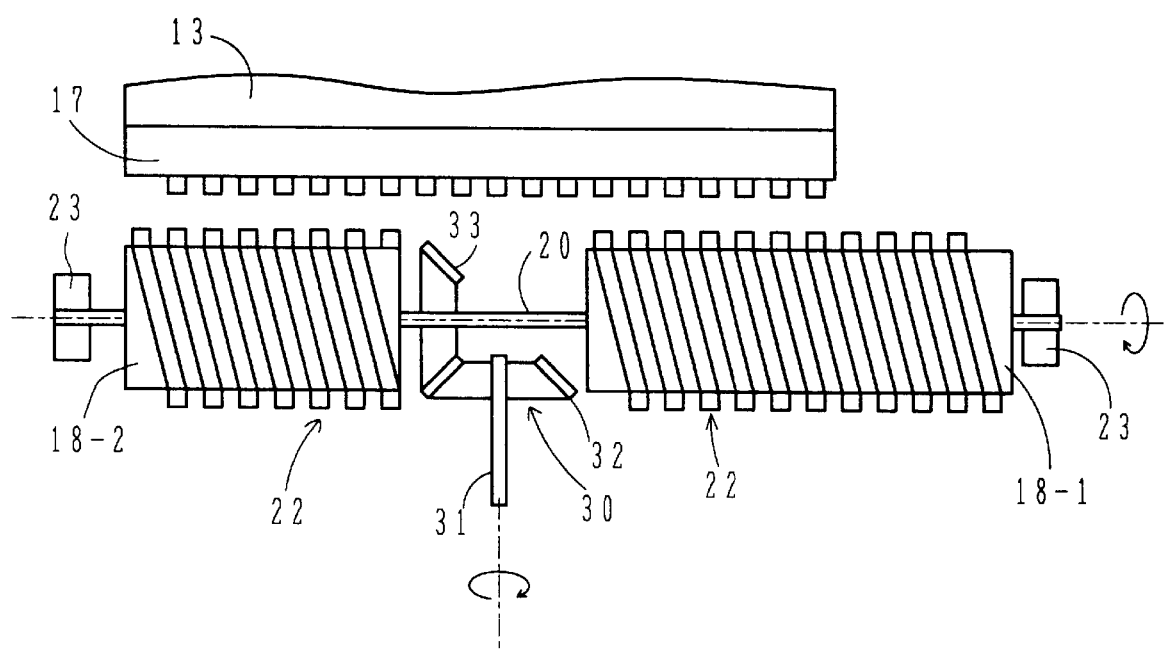
FIG. 7 is a top view showing the relation between the driving shaft provided with the power transmission section and the slider.
Figure 8A:
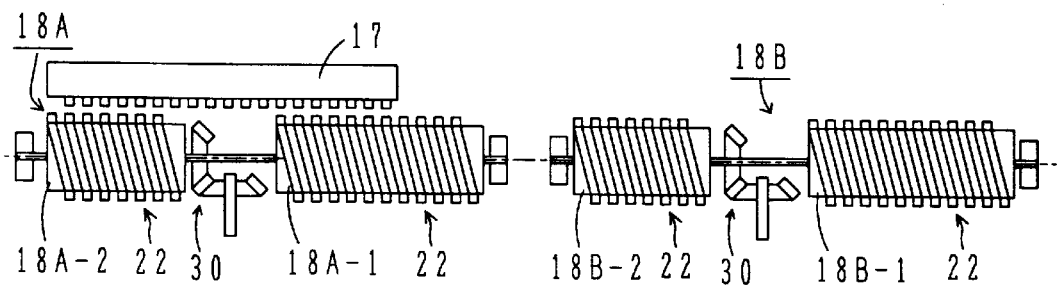
FIG. 8a is a top view showing the initial state of the carrier delivery between the driving shafts.
Figure 8B:
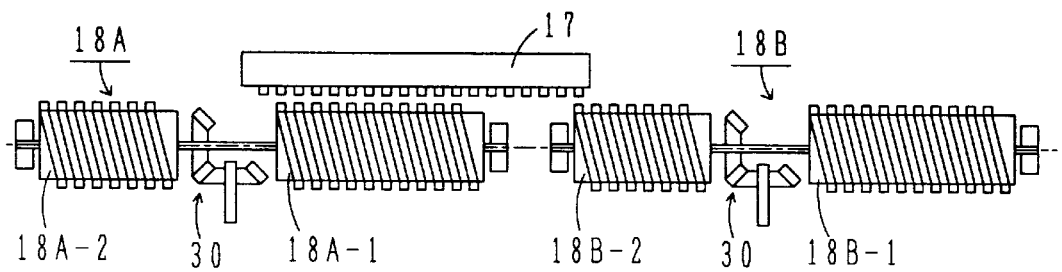
FIG. 8b is a top view showing the state immediately before the carrier delivery between the driving shafts.
Figure 8C:
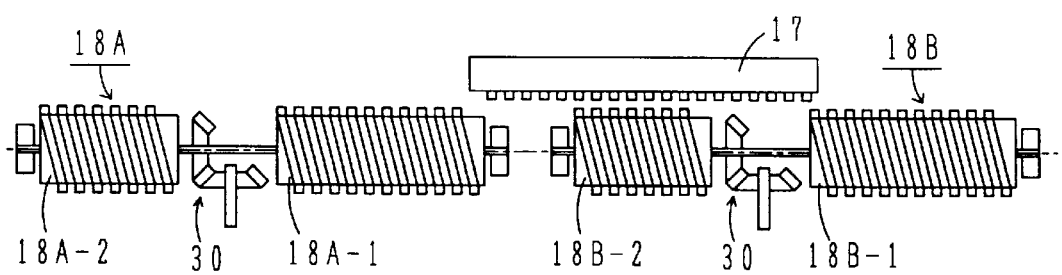
FIG. 8c is a top view showing the state immediately after the carrier delivery between the driving shafts.
Figure 8D:
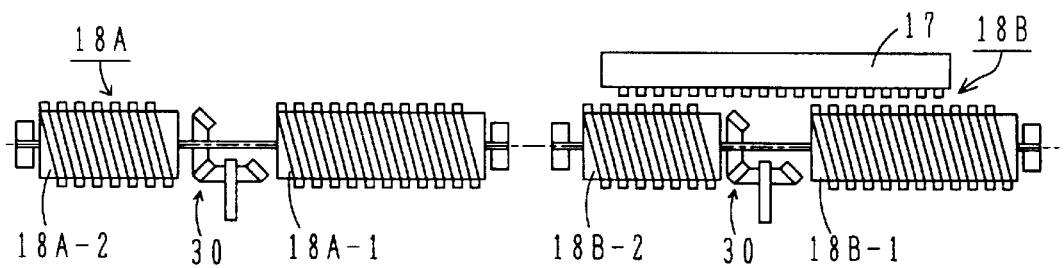
FIG. 8d is a top view showing the completed state of the carrier delivery between the driving shafts.

FIG. 7 is a top view showing a state in which the carrier 13 is transferred from the left side to the right side in accordance with the magnetic coupling between the movable driving shaft 18-2 and fixed driving shaft 18-1 on one hand and the slider 17 on the other in the driving shaft 18 shown in FIG. 6. In FIG. 7, the slider 17 is magnetically coupled with the movable driving shaft 18-2 and the fixed driving shaft 18-1 respectively. As already described in accordance with FIG. 5, the movable driving shaft 18-2 shows a function for matching the magnetic pole of the slider 17 with that of the fixed driving shaft 18-1 and it is moved to the right position in FIG. 7. The slider 17 crosses the relatively large gap between the movable driving shaft 18-2 and fixed driving shaft 18-1 and magnetically couples with the fixed driving shaft 18-1. The slider 17 magnetically coupled with the fixed driving shaft 18-1 further moves rightward in accordance with the magnetic coupling action between the fixed driving shaft 18-1 and the slider 17. During this period, the fixed driving shaft 18-1 and movable driving shaft 18-2 continuously rotate by receiving power from the drive through the power transmission section 30.

FIGS. 8*a* to 8*d* show a state of moving the carrier at the crossing portion between the driving shafts 18A and 18B provided with the power transmission section 30 in four stages. The basic structure and action are substantially the same as those previously described in FIGS. 5*a* to 5*d*. Therefore, detailed description is omitted. However, the difference in structure is, as already described on the driving shaft 18, in that each of the driving shafts 18A and 18B is provided with the power transmission section 30 using a bevel gear for the gap between the divided portions. With the above structure, the driving shafts 18A and 18B receive a driving force from the respectively corresponding drives 19A and 19B shown in FIG. 2, rotate in a predetermined direction, and smoothly move the slider 17 (the carrier 13) at the crossing portion between the driving shafts 18A and 18B.

Figure 9:
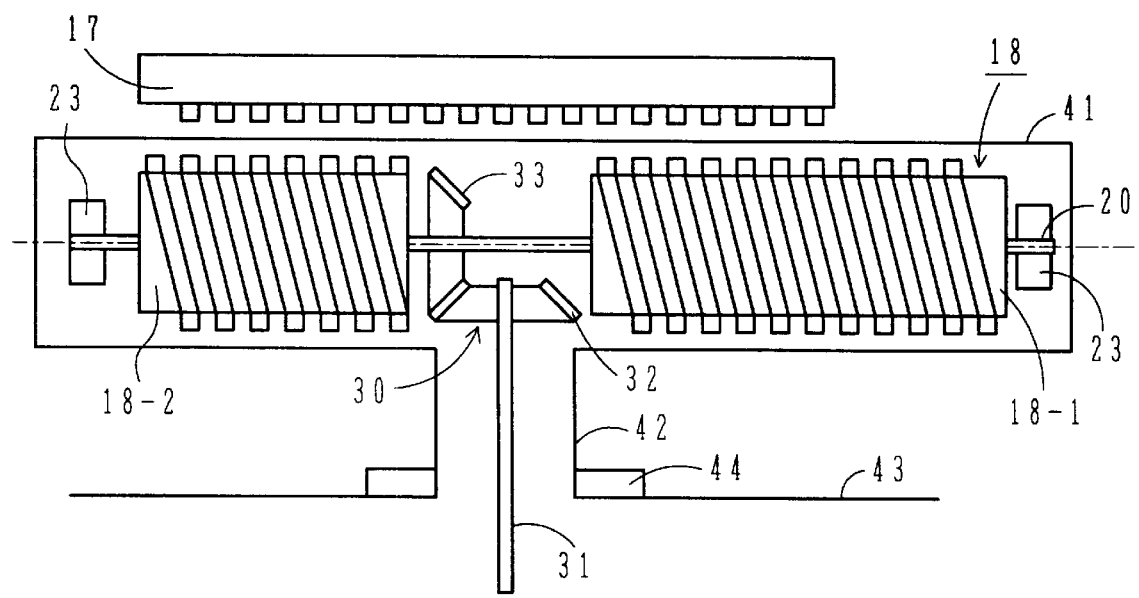
FIG. 9 is a top view showing a setting example of the driving shaft provided with the power transmission section.

FIG. 9 shows another embodiment of the driving shaft 18, in which the basic structure is the same as that shown in FIG. 7. The difference is in that the driving shaft 18 (fixed driving shaft 18-1, movable driving shaft 18-2), shaft core portion 20, support portion 23, power transmission section 30, and shaft portion 31 are arranged in cases 41 and 42 so that they are isolated from the vacuum area in which the carrier 13 (including the slider 17) moves. The internal spaces of the cases 41 and 42 communicate with the external space where the drives 19A to 19C are arranged. A reference numeral 43 denotes a wall of a chamber of the vacuum process system 1 and 44 denotes a support portion for supporting the case 42.

The above structure makes it possible to prevent the dust produced in the power transmission section 30 or the like from affecting others because the space in which the driving shaft 18 and the power transmission section 30 are arranged is isolated form the vacuum environment in the process chamber in which the object 12 is processed.

In the case of each of the above embodiments, a case is described in which the carrier is delivered two driving shafts (e.g. between the driving shafts 18A and 18B shown in FIG. 5 or 8) while the carrier 13 is transferred by assuming the movable driving shaft as the upstream side and the fixed driving shaft as the downstream side (movement from the driving shaft 18A to the driving shaft 18B). On the contrary, of course, it is also possible to deliver the carrier by assuming the fixed driving shaft as the upstream side and the movable driving shaft as the downstream side. That is, it is also possible to move the carrier 13 from the driving shaft 18B to the driving shaft 18A.

Then, a driving shaft 118 having another structure is described below by referring to FIGS. 10 to 13. The driving shaft 118 is obtained by improving the driving shaft 18 described by referring to FIG. 3. In FIGS. 10 to 13, components substantially the same as the components shown in FIG. 3 in function are provided with the same reference numerals and their detailed description are omitted. Particularly, FIGS. 11 to 13 clarify the structure provided a movable driving shaft and a shaft core portion.

The driving shaft 118 has a structure in which a driving shaft portion is divided into two portions similarly to the above described driving shaft 18 and provided with the fixed driving shaft 18-1 and the movable driving shaft 18-2. The fixed driving shaft 18-1 and movable driving shaft 18-2 are set to a common shaft core portion 120. The fixed driving shaft 18-1 is secured to the shaft core portion 120. The movable driving shaft 18-2 is secured in the rotational direction of the shaft core portion 120 but it is set so as to be movable in a certain range in the axial direction of the shaft core portion 120. The shaft core portion 120 is slightly thicker than the above-described shaft core portion 20 and moreover has a large-diameter stopper 120*a* at a predetermined position. The both ends of the shaft core portion 120 are rotatably supported by the support portion (rotary bearing) 23 respectively.

The structure for setting the fixed driving shaft 18-1 at the shaft core portion 120 is the same as the structure previously described. The structure for setting the movable driving shaft 18-2 at the shaft core portion 120 is different from the structure of the above embodiments and has a feature of this embodiment. As shown in FIG. 10, a coil spring 51 is set the left end face of the movable driving shaft 18-2 and the left support portion 23. The movable driving shaft 18-2 is pressed rightward by the coil spring 51. Moreover, the stopper 120 is set to the right side of the movable driving shaft 18-2 to limit the rightward movement of the movable driving shaft 18-2.

Figure 11:
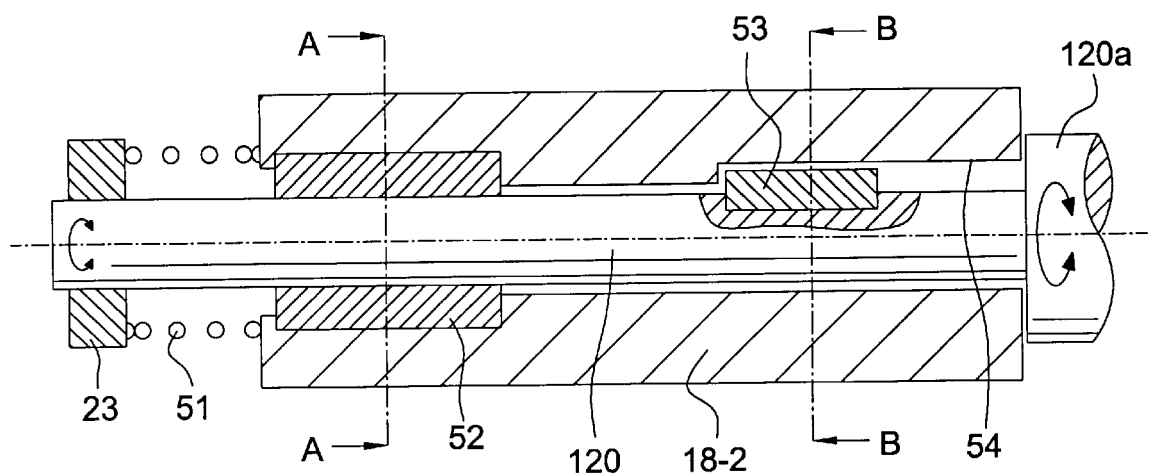
FIG. 11 is a longitudinal sectional view of a movable driving shaft of the driving shaft in FIG. 10.
Figure 12:
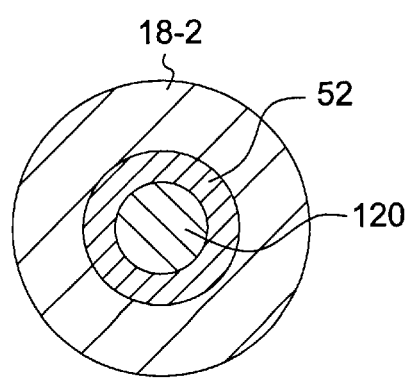
FIG. 12 is a sectional view at the line A—A in FIG. 11.
Figure 13:
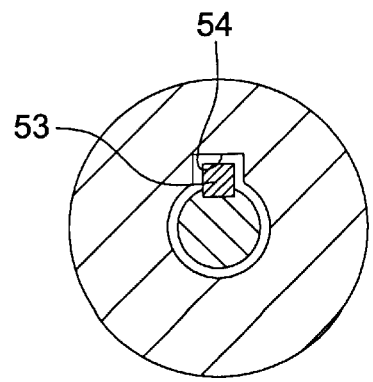
FIG. 13 is a sectional view at the line B—B in FIG. 11.

FIG. 11 shows a detailed longitudinal sectional view of the movable driving shaft 18-2. Moreover, FIGS. 12 and 13 show a sectional view at the line A—A and a sectional view at the line B—B in FIG. 11. The shift core portion 120 is inserted into the hole formed at the shaft core position of the movable driving shaft 18-2 and a slide bearing 52 and a key 53 are set between the movable driving shaft 18-2 and the shaft core portion 120. The slide bearing 52 makes it possible for the movable driving shaft 18-2 to smoothly move in the axial direction of the shaft core portion 120. Moreover, the key 53 substantially fulfills the same function as the above described spline structure, which is secured to the shaft core portion 120 and fitted into a key groove 54 formed on the movable driving shaft 18-2. According to the key 53, when the shaft core portion 120 rotates, the movement is transmitted to the movable driving shaft 18-2. Moreover, when the movable driving shaft 18-2 moves in the axial direction, it is allowed to move by means of the key groove 54.

Moreover, as shown in FIG. 11, when the movable driving shaft 18-2 is in a free state, a force is given to the left end face of the movable driving shaft 18-2 by the coil spring 51 to be extended and the movable driving shaft 18-2 is pressed against the stopper 120. Therefore, when receiving no magnetic force from the outside, the movable driving shaft 18-2 is set to a constant position by the coil spring 51 and a stopper 120a. This represents that the movable driving shaft 18-2 is designed so as to be brought into a predetermined position for the fixed driving shaft 18-1. Furthermore, as shown by the above-described state in FIG. 5b, when the carrier is sent from the left driving shaft, the movable driving shaft 18-2 receives a magnetic force based on the magnetic coupling section of the slider for the carrier, moves leftward against the pressure of the coil spring 51, and moves to a position suitable for making it possible to receive the carrier.

Figure 10:
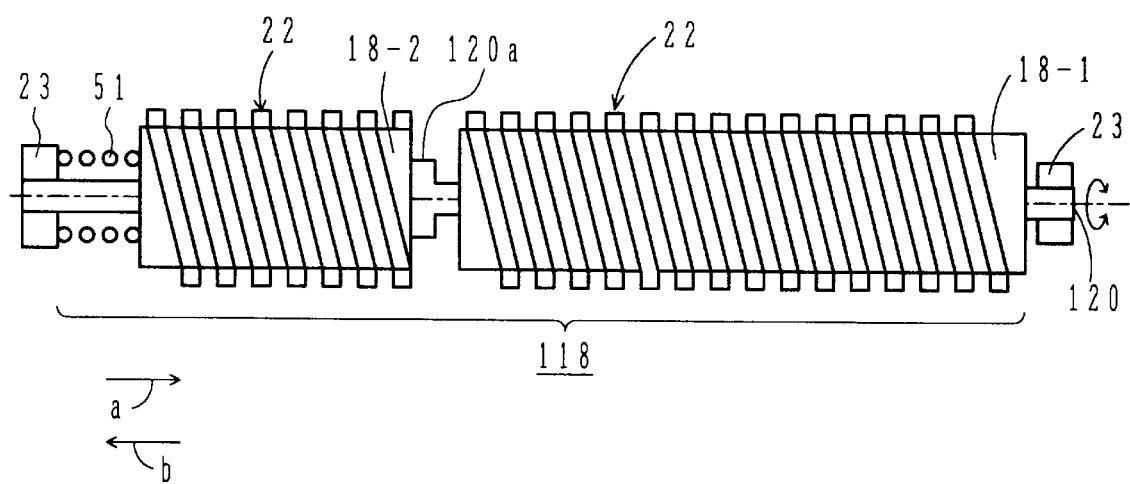
FIG. 10 is a front view showing another example of the driving shaft.

The above-described driving shaft 118 shown in FIG. 10 can be used instead of the driving shafts 18A and 18B described in FIG. 5. In this case, unless the slider 17 is sent from the upstream-side driving shaft, the movable driving shaft 18-1 of the downstream-side driving shaft is present at the right-side predetermined position as described above. When the slider 17 is sent from the upstream-side driving shaft, the movable driving shaft 18-1 is moved to a left-side optimum position by the attractive force of the magnetic coupling section 21 of the slider 17, the driving shafts are matched, and the slider (carrier) can be smoothly delivered between two adjacent driving shafts 118. When the slider is delivered to the movable driving shaft 18-1 of the downstream-side driving shaft 118 and separated from the fixed driving shaft 18-2 of the upstream-side driving shaft 118, the movable driving shaft is moved rightward again by the coil spring 51 and set to a predetermined position. Under the above state, the slider can be smoothly transferred from the movable driving shaft to the fixed driving shaft at the downstream-side driving shaft 118 as shown in FIGS. 5(c) and 5(d).

Though the movement of the above slider (carrier) is the movement in the direction shown by the arrow a in FIG. 10, it is a matter of course that the movement in the opposite direction shown by the arrow b is possible.

In the case of employing the driving shaft 118 with the structure shown in FIG. 10, it is not always necessary to divide a driving shaft into two portions such as a movable driving shaft and a fixed driving shaft. That is, when employing a structure in which a movable driving shaft is set to a normal predetermined position by using a coil spring and a stopper, it is also possible to smoothly move the carrier at the crossing portion between the chambers by using only a movable driving shaft as the driving shaft, preparing a rodlike driving shaft, and providing the rodlike driving shaft for each chamber. This structure is particularly suitable for discontinuous magnetic transfer.

To set the driving shaft of the magnetic transfer mechanism to each of a plurality of chambers successively provided and continuously perform magnetic transfer so that the carriers on which the object to be processed is mounted are simultaneously present in each of a plurality of chambers, it is indispensable that the driving shaft provided for each chamber is divided into two portions (the fixed driving shaft and the movable driving shaft). This is because a receiving-side driving shaft portion and a sending-side driving shaft portion are necessary.

Figure 14:
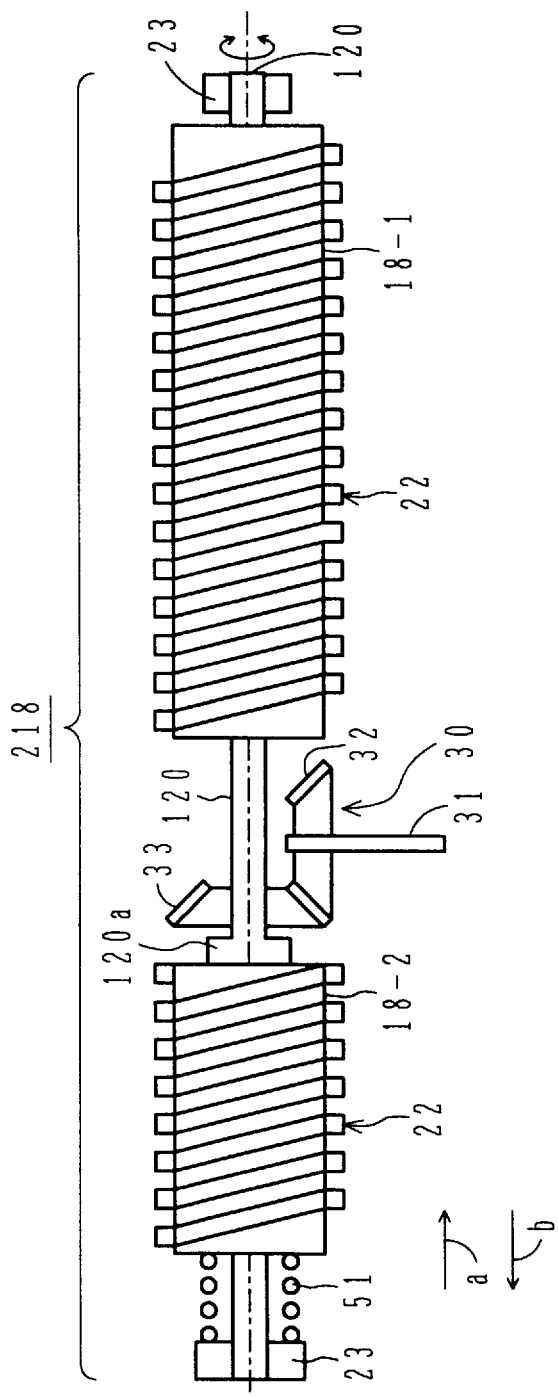
FIG. 14 is a top view showing still another example of the driving shaft provided with the power transmission section.

FIG. 14 shows a modification of the driving shaft 118 described in FIG. 10. The modified driving shaft 218 is provided with a power transmission mechanism and constituted by combining the power transmission mechanism shown in FIG. 6 with the driving shaft shown in FIG. 10. In FIG. 14, components substantially the same as those shown in FIGS. 6 and 10 are provided with the same reference numerals and their detailed description is omitted. Also in the case of the driving shaft 218 shown in FIG. 14, the movable driving shaft 18-2 of the shaft 218 is set to the shaft core portion 120 with the same structure as the above-described driving shaft 118. Moreover, the power transmission section 30 is provided by using the gap between the movable driving shaft 18-2 and the fixed driving shaft 18-1. The driving shaft 218 also makes it possible to transfer the carrier in the directions shown by the arrows a and b as described by referring to FIG. 8, for example.

It is a matter of course that the driving shaft 218 shown in FIG. 14 can be incorporated into the structure shown in FIG. 9 instead of the driving shaft 18.

In the case of the driving shaft 118 shown in FIG. 10 or the driving shaft 218 shown in FIG. 14, the movable driving shaft 18-2 is set to a predetermined position when no external force is given. Therefore, the arrangement positions of the fixed driving shaft 18-1 and the movable driving shaft 18-2 meet a certain positional relation. The certain positional relation is a positional relation for realizing continuous polarization from the fixed driving shaft to the movable driving shaft when spirally forming the above-described magnetic coupling section 22 on the surface of each of the fixed and movable driving shafts through polarization. That is, when the movable driving shaft is present at the predetermined position where the shaft is limited by the stopper, the fixed driving shaft and movable driving shaft including the gap between the shafts are regarded as one driving shaft and continuous polarization is applied to the one driving shaft to constitute the magnetic coupling section 22.

Figure 15:
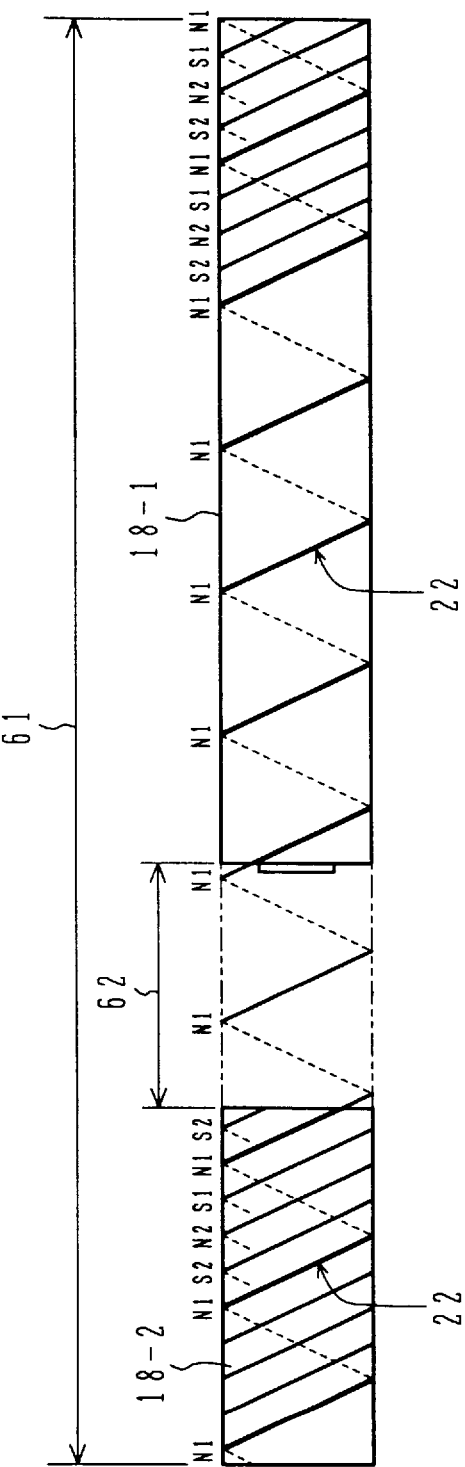
FIG. 15 is an illustration showing a magnetic pole formed on each of two-divided driving shafts.

FIG. 15 shows one example of the continuous polarization. In FIG. 15, the movable driving shaft 18-2 is located at the position determined by the stopper for the fixed driving shaft 18-1. A gap 62 is formed between the fixed driving shaft 18-1 and the movable driving shaft 18-2. The whole 61 is regarded as one driving shaft and magnetic poles N1, S1, N2, and S2 are spirally polarized at a predetermined pitch. In the case of the illustrated example, the entire continuous polarization state is shown only for the magnetic pole N1 for convenience' sake. Because polarization is performed by regarding the whole 61 as one driving shaft, the magnetic pole N1 is also shown in the gap 62. Thus, the magnetic pole N1 is continuously formed by the fixed driving shaft 18-1 and the movable driving shaft 18-2. Other magnetic poles S1, N2, and S2 are also formed through continuous polarization.

In the case of the above example, the magnetic coupling section 22 is formed through polarization. Also when forming the magnetic coupling section 22 by the spiral magnet, it is formed continuously.

As described above, when the movable driving shaft is present at a right-end predetermined position for the fixed driving shaft, it is possible to smoothly move the carrier because each magnetic pole on the two shafts is formed continuously.

What is claimed is:

1. A magnetic transfer system for moving an object along a transfer route between at least two chambers separable from each other by a retractable partition that forms a gap between said at least two chambers, the transfer system comprising:

a movable body for supporting the object, said movable body having a magnetic coupling section;

an independent drive section for each of the at least two chambers, each drive section separated from an adjacent drive section by the gap and comprising a rotational driving member comprising at least a first divided portion and a second divided portion divided in an axial direction of said rotational driving member, said first divided portion is secured to a rotatable shaft core member, said second divided portion is secured to said shaft core member and is movable in the axial direction within a predetermined range of movement, and at least one pair of spiral magnetic coupling sections are formed on the surface of each of said first divided portion and said second divided portion at the same pitch, said magnetic coupling section of said movable body interacting with the spiral magnetic coupling sections of the rotational driving member to move the movable body in the axial direction and along the transfer route by the rotation of said rotational driving member.

2. A magnetic transfer system as claimed in claim 1, wherein said second divided portion is connected to said shaft core member through a key and pressed toward said first divided portion by a coil spring and positioned by a stopper formed on said shaft core member.

3. A magnetic transfer system as claimed in claim 1, wherein said second divided portion and said shaft core member are connected to each other by a spline structure.

4. A magnetic transfer system as claimed in claim 1, wherein the spiral magnetic coupling sections of said rotational driving member have a magnet arrangement in which N and S poles are alternately arranged and the magnetic coupling section of said movable body is made of a material with a high magnetic permeability.

5. A magnetic transfer system as claimed in claim 1, wherein the spiral magnetic coupling sections of said rotational driving member are made of a ferromagnetic material and the magnetic coupling section of said movable body has a magnet arrangement in which N and S poles are alternately arranged.

6. A magnetic transfer system as claimed in claim 1, wherein said rotational driving member includes a space between said first divided portion and said second divided portion when said second divided portion is present at a position closest to said first divided portion within the predetermined range of movement, and said spiral magnetic coupling sections are continuously formed on said first and second divided portions of said rotational driving member when the second divided portion is at the position closest to the first divided portion.

7. A magnetic transfer system as claimed in claim 1, wherein the predetermined range of movement of said second divided portion is equal to or more than the pitch but it is two times or smaller than the pitch.

8. A magnetic transfer system as claimed in claim 1, wherein said rotational driving member is arranged in atmosphere and said movable body is arranged in a position isolated from the atmosphere.

9. A magnetic transfer system as claimed in claim 8, wherein said position isolated from the atmosphere is in a vacuum environment.

10. A magnetic transfer system as claimed in claim 1, wherein a power transmission section for transmitting power from a drive to said rotational driving member is provided in the space between said first divided portion and said second divided portion.

11. A magnetic transfer system as claimed in claim 10, wherein said power transmission section comprises a bevel gear mechanism.

12. A power transmission mechanism of a magnetic transfer system, comprising:

a rotational driving member which is divided into at least two portions in its axial direction to form a first divided portion and a second divided portion and in which said first divided portion is secured to a shaft core member and said second divided portion is movable in the axial direction relative to the shaft core member within a predetermined range of movement, and at least one pair of spiral magnetic coupling sections is formed on the surface of each of said first divided portion and said second divided portion at the same pitch;

a movable body movable in the axial direction and having magnetic coupling sections at an interval equal to the pitch in said spiral magnetic coupling sections and facing the surface of said rotational driving member; and a power transmission section engaging the rotational driving member between the first divided portion and second divided portion to rotate said rotational driving member and move the movable body in the axial direction.

13. A power transmission mechanism of a magnetic transfer system as claimed in claim 12, wherein said second divided portion is connected to said shaft core member through a key and pressed toward said first divided portion by a coil spring, and positioned by a stopper formed on said shaft core member.

14. A power transmission mechanism of a magnetic transfer system as claimed in claim 12, wherein said second divided portion and said shaft core member are connected to each other by a spline structure.

15. A power transmission mechanism of a magnetic transfer system as claimed in claim 12, wherein the spiral magnetic coupling sections of said rotational driving member have a magnet arrangement in which N and S poles are alternately arranged and the magnetic coupling sections of said movable body are made of a material with a high magnetic permeability.

16. A power transmission mechanism of a magnetic transfer system as claimed in claim 12, wherein the spiral magnetic coupling sections of said rotational driving member are made of a ferromagnetic material and the magnetic coupling sections of said movable body have a magnet arrangement in which N and S poles are alternately arranged.

17. A power transmission mechanism of a magnetic transfer system as claimed in claim 12, wherein a gap is formed between said first divided portion and said second divided portion when said second divided portion is present at a position closest to said first divided portion within the predetermined range of movement, and the spiral magnetic coupling sections are continuously formed on said first and second divided portions of said rotational driving member.

18. A power transmission mechanism of a magnetic transfer system as claimed in claim 12, wherein the predetermined range of movement of said second divided portion is equal to or more than the pitch but two times or less than the pitch.

19. A power transmission mechanism of a magnetic transfer system as claimed in claim 12, wherein said power transmission section comprises a bevel gear mechanism.

20. A power transmission mechanism of a magnetic transfer system as claimed in claim 12, wherein said rotational driving member and said power transmission section are arranged in a chamber covered with partitions and isolated from a space where said movable body is present.

21. A power transmission mechanism of a magnetic transfer system as claimed in claim 12, wherein said rotational driving member is arranged in atmosphere and said movable body is arranged in a position isolated from the atmosphere.

22. A power transmission mechanism of a magnetic transfer system as claimed in claim 21, wherein said position isolated from the atmosphere is in a vacuum environment.

23. A rotational driving member for moving a movable body in a linear direction, comprising:
   a rotatable shaft core member having an axis extending in the linear direction;
   a first divided portion secured to and rotatable with the shaft core member, a second divided portion rotatable with said shaft core member and movable within a predetermined range of movement relative to the shaft core member in the linear direction, and at least one pair of spiral magnetic coupling sections formed on the surface of each of said first divided portion and said second divided portion at the same pitch.

24. A rotational driving member as claimed in claim 23, wherein said second divided portion is connected to said shaft core member through a key, pressed toward said first divided portion by a coil spring, and positioned by a stopper formed on said shaft core member.

25. A rotational driving member as claimed in claim 23, wherein said second divided portion and said shaft core member are to each other by a spline structure.

26. A rotational driving member as claimed in claim 23, wherein the spiral magnetic coupling sections of said rotational driving member have a magnet arrangement in which N and S poles are alternately arranged and the magnetic coupling sections of said movable body are made of material with a high magnetic permeability.

27. A rotational driving member as claimed in claim 23, wherein the spiral magnetic coupling sections of said rotational driving member are made of a ferromagnetic material and the magnetic coupling sections of said movable body have a magnet arrangement in which N and S poles are alternately arranged.

28. A rotational driving member as claimed in claim 23, further comprising a gap between said first divided portion and said second divided portion when said second divided portion is present at a position closest to said first divided portion within the predetermined range of movement, and said spiral magnetic coupling sections are continuously formed on said first and second divided portions.

29. A rotational driving member as claimed in claim 23, wherein the predetermined range of movement of said second divided portion is equal to or more than the pitch but two times or less than the pitch.

30. A rotational driving member as claimed in claim 28, further comprising a power transmission section for transmitting power to the shaft core member and engaging the shaft core member in the gap between said first divided portion and said second divided portion.

31. A rotational driving member as claimed in claim 30, wherein said power transmission section comprises a bevel gear mechanism.

32. A magnetic transfer system for moving an object along a transfer route between at least two chambers separable from each other by a retractable partition that forms a gap between said at least two chambers in said transfer route, the magnetic transfer system comprising:
   a drive section comprising a rotational driving member connected to a shaft core member through a key, pressed toward one side by a coil spring, and positioned by a stopper formed on said shaft core member, the rotational driving member rotatable with said shaft core member and movable relative to the shaft core member in an axial direction within a predetermined range of movement, and having at least one pair of spiral magnetic coupling sections formed on its surface; and
   a movable body having magnetic coupling sections on a portion facing the surface of said rotational driving member at an interval equal to a pitch in said spiral magnetic coupling sections, said movable body being linearly moved by the rotation of said rotational driving member.

33. A magnetic transfer system as claimed in claim 32, wherein the spiral magnetic coupling sections of said rotational driving member have a magnetic arrangement in which N and S poles are alternately arranged and the magnetic coupling sections of said movable body are made of a material with a high magnetic permeability.

34. A magnetic transfer system as claimed in claim 32, wherein the spiral magnetic coupling section of said rotational driving member is made of a ferromagnetic material and the magnetic coupling section of said movable body has a magnetic arrangement in which N and S poles are alternately arranged.

* * * * *